United States Patent
Suehiro et al.

(10) Patent No.: US 7,161,187 B2
(45) Date of Patent: Jan. 9, 2007

(54) LIGHT EMITTING DIODE AND MANUFACTURING METHOD THEREOF

(75) Inventors: Yoshinobu Suehiro, Nishikasugai-gun (JP); Hideaki Kato, Nishikasugai-gun (JP); Kunihiro Hadame, Nishikasugai-gun (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/972,534

(22) Filed: Oct. 26, 2004

(65) Prior Publication Data

US 2005/0082561 A1    Apr. 21, 2005

Related U.S. Application Data

(62) Division of application No. 10/102,813, filed on Mar. 22, 2002, now Pat. No. 6,833,566.

(30) Foreign Application Priority Data

Mar. 28, 2001  (JP) ............... P. 2001-091961
Oct. 4, 2001   (JP) ............... P. 2001-308256

(51) Int. Cl.
  *H01L 29/22*   (2006.01)
  *H01L 29/227*  (2006.01)
  *H01L 33/00*   (2006.01)

(52) U.S. Cl. ............ 257/98; 257/99; 257/100; 257/E33.056; 257/E33.058; 257/E33.059; 257/E25.032

(58) Field of Classification Search ......... 257/98, 257/99, 100, E33.058, E33.059, E33.057, 257/E33.056, E25.032
See application file for complete search history.

(56) References Cited

U.S. PATENT DOCUMENTS

| | | | |
|---|---|---|---|
| 5,670,797 A | 9/1997 | Okazaki | |
| 5,882,949 A | 3/1999 | Okazaki | |
| 5,998,232 A | 12/1999 | Maruska | |
| 6,171,877 B1* | 1/2001 | Webb | 438/25 |
| 6,184,544 B1* | 2/2001 | Toda et al. | 257/98 |
| 6,392,294 B1 | 5/2002 | Yamaguchi | |
| 6,429,464 B1* | 8/2002 | Lin | 257/99 |
| 6,614,103 B1* | 9/2003 | Durocher et al. | 257/678 |
| 6,729,746 B1* | 5/2004 | Suehiro et al. | 362/241 |
| 6,886,962 B1* | 5/2005 | Suehiro | 362/241 |
| 2002/0001192 A1 | 1/2002 | Suehiro et al. | |
| 2002/0039001 A1 | 4/2002 | Nagai et al. | |
| 2002/0042156 A1 | 4/2002 | Chen | |
| 2002/0053742 A1 | 5/2002 | Hata et al. | |
| 2002/0070449 A1 | 6/2002 | Yagi et al. | |

FOREIGN PATENT DOCUMENTS

WO    WO 98/34285    8/1998

* cited by examiner

*Primary Examiner*—Thomas Dickey
*Assistant Examiner*—Victor A. Mandala, Jr.
(74) *Attorney, Agent, or Firm*—McGinn IP Law Group, PLLC

(57) ABSTRACT

A light emitting diode has a substrate having a heat radiation conductive member therein, and a light emitting element mounted on the substrate. At least a part of the light emitting element is directly brought into contact and electrically connected with the heat radiation conductive member.

21 Claims, 7 Drawing Sheets

LIGHT EMITTING DIODE AND MANUFACTURING METHOD THEREOF

The present Application is a Divisional Application of U.S. patent application Ser. No. 10/102,813 filed on Mar. 22, 2002 now U.S. Pat. No. 6,833,566.

The present application is based on Japanese Patent Applications Nos. 2001-091961 and 2001-308256, which are incorporated herein by reference.

BACKGROUND OF THE INVENTION

1. Field of the Invention

The present invention relates to what is called a flip-chip-type light emitting diode (hereunder sometimes abbreviated as "an LED") adapted so that a light emitting element is electrically connected to leads through the rear surface electrode thereof. The present invention also relates to a light shielding/reflecting type device adapted so that light outputted from a light source is reflected by a concave reflecting mirror and that the reflected light is radiated from an optical opening portion provided in a light shielding plate, and to the light source therefore. Incidentally, in the present specification, an LED chip itself is referred to as "a light emitting element". Further, a light emitter sealed with a resin lens is referred to as a "light source". Further, the entire light emitting apparatus including an optical device, such as package resin, on which an LED chip is mounted, or as a lens system, is referred to as "a light emitting diode", "an LED" or "a device".

2. Description of the Related Art

Hitherto, a light emitting diode has been constructed by employing what is called a flip-chip structure adapted so that when a light emitting element, such as a GaN light emitting element, having both of an anode electrode and a cathode electrode provided on one side thereof is mounted on an LED diode, the mounting of the light emitting element thereon is performed through a zener diode with the (transparent) electrode side down (see WO98-34285).

An example of such a conventional light emitting diode is described hereinbelow with reference to FIG. 11. FIG. 11 is a sectional view illustrating the configuration of a part, on which a light emitting element of the conventional light emitting diode is mounted, of the conventional light emitting diode. As illustrated in FIG. 11, in this light emitting diode 51, a reflecting mirror 53c is formed from one 53a of a pair of leads 53a and 53b for supplying electric power to a GaN light emitting element 52. A zener diode 54 is mounted on the bottom surface of this light emitting diode 51 by using silver paste. Two kinds of electrodes 54a and 54b are formed on the top surface of the zener diode 54. Two sorts of electrodes provided on the bottom surface of the light emitting element 52 are connected onto those electrodes 54a and 54b by using gold bumps 55a and 55b. Moreover, the light emitting element 52 is mounted thereon. A wire 56 is bonded to one 54b of the electrodes formed on the top surface of the zener diode 54 and electrically connected to the lead 53b corresponding to the other electrode 54b. Thus, the light emitting element 52 is mounted on the zener diode 54 and emits light by being supplied with electric power by the pair of leads 53a and 53b.

However, in such a light emitting diode 51, the light emitting element 52 is mounted one 53a of the leads through the zener diode 54. Thus, this conventional light emitting diode has drawbacks in that heat dissipation is poor, that consequently, the temperature of the light emitting element 52 rises to a high level, and luminous efficiency lowers, and device lifetime decreases. Further, even when the reflecting mirror 53c is provided in such a way as to surround the light emitting element 52, as illustrated in FIG. 11, the reflecting mirror 53c is away from the light emitting element 52 owing to the zener diode 54, and that thus, sufficient optical characteristics cannot be obtained.

Further, light emitting diodes include a reflective LED. An example of this reflective LED is described hereinbelow with reference to FIG. 12. FIG. 12 is a sectional view illustrating an example of a reflective LED. As illustrated in FIG. 12, this reflective LED 131 has a light emitting element 132 mounted at an end portion of one 133b of a pair of leads 133a and 133b for supplying electric power thereto. Further, the light emitting element 132 is electrically connected to the other lead 133a through wire bonding using a wire 134. The light emitting element 132, the pair of leads 133a and 133b, and the wire 134 are sealed with transparent epoxy resin 135. A reflecting surface, which has a focal point at the position of the light emitting element 132 and is shaped like a paraboloid of revolution, is formed at a place at which the reflecting surface faces the light emitting element 132. A concave reflecting mirror 136 is formed by evaporating aluminum on the outer reflecting surface thereof.

When light is emitted from the light emitting element 132, the light is upwardly reflected by each part of the reflecting mirror 136 parallel to the central axis of the reflecting surface shaped like a paraboloid of revolution. Then, the reflected light is radiated from the top surface, which is a flat radiating surface 137, of the reflective LED 131 to the outside. Thus, the reflective LED 131 can externally radiate the light, which is emitted from the light emitting element 132, as light obtained by being condensed with high efficiency.

However, the conventional reflective LED 131 has problems in that because the area of the reflecting surface seen from the outside is large, large dark noises are caused (that is, what is called pseudo-lighting occurs) owing to the reflection of external light at each turn-off of the light source, and that consequently, the contrast between the intensity of the light, which is radiated during the light source is turned on, and that of the light reflected when the light source is turned off, is low.

SUMMARY OF THE INVENTION

Accordingly, an object of the present invention is to provide a light emitting diode, which sufficiently shows the characteristics of a light emitting element, by forming a flip chip structure without using a zener diode, and to provide a manufacturing method therefor.

Another object of the present invention is to provide a light shielding/reflecting type device, which shows high efficiency in external radiation of light and high contrast between the intensity of light, which is radiated during the light source is turned on, and that of light reflected when the light source is turned off, and to provide a light source therefor.

To achieve the foregoing object, according to the invention, there is provided a light emitting diode (hereunder referred to as a first light emitting diode of the invention) having a flip-chip-type light emitting element. In this diode, a through hole of a through-hole substrate is filled with metal. Further, one of rear surface electrodes of the light emitting element is connected onto the throughhole. Moreover, the other of the rear surface electrodes of the light emitting element is connected to a conductive pattern insulated from the through hole of the through-hole substrate.

In the case of the LED of such a configuration, fine and precise conductive patterns of the through hole substrate can be formed. Thus, two rear surface electrodes, the distance between which is very short, of the light emitting element can be adapted so that one of the rear surface electrodes is reliably connected onto the through hole, while the other of the rear surface electrodes is reliably connected onto the conductive pattern insulated from the through hole by maintaining the insulation therebetween. Further, because the through hole is filled with metal, the through hole can serve as a heat sink. Thus, the LED excels in heat radiation. Consequently, luminous efficiency is maintained at a high level. The device lifetime can be increased.

Thus, the LED, which sufficiently exhibits the characteristics of the light emitting element, is provided by forming a flip-chip structure without using a zener diode.

According to another aspect of the invention, there is provided a light emitting diode (hereunder referred to as a second light emitting diode of the invention) having a flip-chip-type light emitting element. This diode comprises an insulating film fixed on the top surface of one of a pair of leads for supplying electric power to the light emitting element. This diode comprises two conductive foils formed on the insulating film in such a way as to be away from each other. In this diode, rear surface electrodes of the light emitting element are respectively connected to the two conductive foils. Further, one of the two conductive foils is electrically connected to the one of leads, and the other of the two conductive foils is electrically connected to the other of the pair of leads.

In the LED of such a configuration, the insulating film is fixed onto one of the leads, so that the rear surface electrodes of the light emitting element are insulated from the one of the leads. Further, the rear surface electrodes of the light emitting element are connected to the two conductive foils formed on the insulating film in such a way as to be away from each other. Furthermore, the two conductive foils are electrically connected to the one of the leads and the other lead, respectively. Thus, the rear surface electrodes of the light emitting element are electrically connected to the one of the leads and the other lead, respectively. In this way, the flip-chip structure is formed. Further, the light emitting element is put on the one of the leads through an extremely thin insulating film and the conductive foil. Thus, this LED extremely excels in heat radiation. Consequently, luminous efficiency is maintained at a high level. The device lifetime can be increased.

Thus, the LED, which sufficiently shows the characteristics of the light emitting element, is provided by forming a flip-chip structure without using a zener diode.

According to another aspect of the invention, there is provided a light emitting diode (hereunder referred to as a third light emitting diode of the invention) having a flip-chip-type light emitting element. This diode comprises an insulating film fixed on a top surface of one of a pair of leads for supplying electric power to the light emitting element, and a conductive foils formed on the insulating film. In this diode, one of rear surface electrodes of the light emitting element is connected to the conductive foil. The other of the rear surface electrodes, and the conductive foil is electrically connected to the other of the pair of leads.

In the LED of such a configuration, one of the rear surface electrodes of the light emitting element is connected to the conductive foil insulated from one of the leads through the insulating film. Further, the conductive foil is electrically connected to the other lead by a wire. In contrast, the other of the rear surface electrodes of the light emitting element is connected directly to the one of the leads by a gold bump. Thus, the rear surface electrodes of the light emitting element are electrically connected to the one of the leads and the other lead, respectively. The flip-chip structure is formed in this manner. Further, a part of the light emitting element is put on the one of the leads through an extremely thin insulating film and conductive foil, while the remaining part of the light emitting element is put directly on the one of the leads. Consequently, this LED extremely excels in heat radiation. Further, luminous efficiency is maintained at a high level. The device lifetime can be increased.

Thus, the LED, which sufficiently exhibits the characteristics of the light emitting element, is provided by forming a flip-chip structure without using a zener diode.

According to an embodiment (hereunder referred to as a fourth light emitting diode of the invention) of the third light emitting diode of the invention, a concave reflecting mirror is formed from the one of leads in the third light emitting diode of the invention. Moreover, the light emitting element is placed on the bottom surface of the reflecting mirror.

Light outputted in a horizontal direction from the light emitting surface of the light emitting element is reflected and irradiated by such a concave reflecting mirror in a direction nearly perpendicular to the light emitting surface thereof. Thus, the efficiency in external radiation from this LED is enhanced. Further, one of the rear surface electrodes of the light emitting element is insulated from one of lead by an insulating film and connected to the conductive foil extended to the edge of the reflecting mirror constituted by the one of the leads. Furthermore, the conductive foil is electrically connected to the other lead by a wire. In contrast, the other of the rear surface electrodes of the light emitting element is connected directly to the one of the leads by a gold bump. Consequently, the rear surface electrodes of the light emitting element are electrically connected to the one of the leads and the other lead, respectively. Thus, the flip-chip structure is formed. Therefore, the light emitting element is mounted on the bottom surface of the reflecting mirror through no zener diodes. Consequently, this LED can sufficiently serve as the reflecting mirror. Thus, sufficient optical characteristics can be obtained.

Further, a part of the light emitting element is put on the one of the leads through an extremely thin insulating film and conductive foil, while the remaining part of the light emitting element is put directly on the one of the leads.

Thus, the LED, which sufficiently shows the luminous efficiency, the device lifetime, and the optical characteristics of the light emitting element, is provided by forming both the flip-chip structure and the reflecting mirror without using a zener diode.

According to an embodiment (hereunder referred to as a fifth light emitting diode of the invention) of one of the first to fourth light emitting diodes of the invention, a part of the through-hole substrate or a part of the pair of leads, and the light emitting element are sealed with a light transmissive material. In the fifth light emitting diode, a surface portion, which is provided at the side of a light emitting surface of the light emitting element, of the light transmissive material is formed as a light radiating surface portion.

A quantity of light radiated from the light emitting element sealed with a light transmissive material in this manner is about twice that of light radiated in the case of the light emitting element, which is not sealed. Thus, the efficiency in external radiation is extremely enhanced. Moreover, because the light emitting element is mounted by forming the flip-chip structure without using a zener diode, this LED extremely excels in heat radiation. Furthermore, high luminous efficiency is maintained, and device lifetime increases.

Thus, the LED, which sufficiently shows the luminous efficiency, the device lifetime, and the external radiation efficiency of the light emitting element, is provided by forming the flip-chip structure and sealing the light emitting element with the light transmissive material without using a zener diode.

According to an embodiment (hereunder referred to as a sixth light emitting diode of the invention) of the fifth light emitting diode of the invention, the light radiating surface portion is a convex lens.

Thus, light emitted from the light emitting element is converged and externally radiated by sealing the light emitting element with the light transmissive material and providing the light radiating surface of the convex lens at the side of the light emitting surface of the light emitting element. Thus, this LED excels in optical characteristics. Moreover, the quantity of light radiated from the light emitting element is increased by sealing the light emitting element with the light transmissive material, to a value, which is almost twice that of light radiated from a light emitting element that is not sealed with such a material. Thus, the efficiency in external radiation is extremely enhanced. Moreover, because the light emitting element is mounted by forming the flip-chip structure without using a zener diode, this LED extremely excels in heat radiation. Furthermore, high luminous efficiency is maintained, and device lifetime increases.

Thus, the LED, which more excels in the luminous efficiency, the device lifetime, the efficiency in external radiation and the light convergence characteristics, is obtained by forming the flip-chip structure without using a zener diode, and by sealing the light emitting element with the light transmissive material and by providing a light radiating surface of the convex lens.

According to another aspect of the invention, there is provided a method (hereunder referred to as a first manufacturing method of the invention) of manufacturing a light emitting diode, which comprises the step of sticking an insulating film, on which a conductive foil is put, to a part of one of a pair of leads for supplying electric power to a light emitting element, the step of stamping the one of leads to thereby form a concave reflecting mirror, at the central portion of which one of ends of the conductive foil of the insulating film is placed, and the step of processing a concave surface of the reflecting mirror in such a way as to be round-cornered, and the step of connecting one of rear surface electrodes of the light emitting element to an end of the conductive foil at the central portion of the concave reflecting mirror, and the step of electrically connecting the other end of the conductive foil to the one of the pairs of the leads.

According to this method of manufacturing the light emitting diode, after sticking an insulating film, on which a conductive foil is put, onto one of a pair of leads, the stamping of the one of leads is performed to thereby form a concave reflecting mirror. Then, an end of each of the film and the foil is placed at the central portion of the reflecting mirror. Moreover, a concave surface of the reflecting mirror is processed in such a way as to be round-cornered. Thus, the light emitting element can be mounted at the central portion of the reflecting mirror. Furthermore, the conductive foil can be reliably prevented by round-cornering the concave surface of the reflecting mirror from being cut off during the stamping. Subsequently, at the central portion of the reflecting mirror, one of the rear surface electrodes of the light emitting element is electrically connected to one end of the conductive foil by a gold bump. Moreover, the other of the rear surface electrodes of the light emitting element is connected directly to one of the leads by a gold bump. Then, the other end of the conductive foil is electrically connected to the other lead by a wire. Thus, the flip-chip structure is formed.

According to this method of manufacturing a light emitting diode, the light emitting element can be mounted thereon by utilizing the flip-chip structure without using a zener diode. Moreover, the conductive foil for electrically connecting one of the rear surface electrodes of the light emitting element to the other lead can be reliably prevented from being cut off during the reflecting mirror is formed. Further, the light emitted from the light emitting surface of the light emitting element in the horizontal direction is reflected in the direction, which is nearly perpendicular to the light emitting surface, so that the efficiency in external radiation from the LED is enhanced.

Thus, the heat radiation from the light emitting element is enhanced by forming the flip-chip structure without using a zener diode and by forming a round-cornered concave reflecting mirror. Consequently, the first manufacturing method of manufacturing LEDs, which excels in the luminous efficiency, the device lifetime, and can obtain sufficient optical characteristics, and provide highly reliable electrical connection, is provided.

According to an embodiment (hereunder referred to as a second manufacturing method of the invention) of the first manufacturing method of the invention, the step of sealing a part of the pair of leads, the reflecting mirror, and the light emitting element with a light transmissive material, and forming a surface, which is provided at a side of a light emitting surface of the light emitting element, of the light transmissive material as a light radiating surface is added to the first manufacturing method.

A quantity of light radiated from the light emitting element sealed with a light transmissive material in this manner is about twice that of light radiated in the case of the light emitting element, which is not sealed. Thus, the efficiency in external radiation is extremely enhanced. Moreover, because the light emitting element is mounted at the central portion of the reflecting mirror by forming the flip-chip structure without using a zener diode, this LED extremely excels in heat radiation. Furthermore, high luminous efficiency is maintained, and device lifetime increases, and the efficiency in external radiation is enhanced.

Thus, this LED manufacturing method, which more excels in the luminous efficiency, the device lifetime, and the efficiency in external radiation of the light emitting element, is provided by forming the flip-chip structure without using a zener diode and by sealing the light emitting element with the light transmissive material to thereby form the light radiating surface.

According to an embodiment (hereunder referred to as a third manufacturing method of the invention) of the second manufacturing method of the invention, the light radiating surface portion is a convex lens.

Thus, light emitted from the light emitting element is converged and externally radiated by sealing the light emitting element with the light transmissive material and providing the light radiating surface of the convex lens at the side of the light emitting surface of the light emitting element. Thus, the third manufacturing method excels in optical characteristics. Moreover, the quantity of light radiated from the light emitting element is increased by sealing the light emitting element with the light transmissive material, to a value that is almost twice that of light radiated from a light emitting element that is not sealed with such a material. Thus, the efficiency in external radiation is extremely enhanced. Moreover, because the light emitting element is mounted at the central portion of the reflecting mirror by forming the flip-chip structure without using a zener diode, the third manufacturing method extremely excels in heat radiation. Furthermore, the high luminous efficiency is maintained, and the device lifetime increases, and the efficiency in external radiation is enhanced.

Thus, the LED, which more excels in the luminous efficiency, the device lifetime, the efficiency in external radiation and the light convergence characteristics, is obtained by forming the flip-chip structure without using a zener diode, and by sealing the light emitting element with the light transmissive material and by providing a light radiating surface of the convex lens.

Still further, to achieve the foregoing object, according to an aspect of the invention, there is provided a light shielding/reflecting type device (hereunder referred to as a first light shielding/reflecting type device of the invention) having a light source portion, which has a light emitting portion, a reflecting mirror opposed to a light radiating side of the light source portion, and a light shielding plate, which has an optical opening portion. This device comprises a substrate portion on which the light source portion is mounted. Further, the side, on which the light source portion is mounted, of the substrate portion is black.

Incidentally, the optical opening portion is an opening portion, through which light can pass, and may be either a through hole or a hole filled with a light transmissive material.

The light shielding/reflecting type device of such a structure has the substrate portion on which the light source portion is mounted. The side, on which the light source portion is mounted, of the substrate portion is black. Thus, even in the case that external light is incident from the optical opening portion when the light source is turned off, the incident light is reflected by the reflecting mirror to the side, on which the light source portion is mounted, of the substrate portion and absorbed thereinto. Therefore, the incident light does not return to the outside. Consequently, an occurrence of pseudo-lighting is completely prevented. Thus, the contrast between the intensity of light, which is radiated during the light source is turned on, and that of light reflected when the light source is turned off, is increased.

Thus, the light shielding/reflecting type device is high in efficiency in external radiation and large in contrast between the intensity of light, which is radiated during the light source is turned on, and that of light reflected when the light source is turned off.

An embodiment (hereunder referred to as a second light shielding/reflecting type device of the invention) of the first light shielding/reflecting type device of the invention further comprises a spacer for changing a height of the substrate portion. This spacer is black.

Thus, the focal length thereof is increased by providing the spacer therein. Consequently, the light shielding/reflecting type device has light distribution characteristics that provide a high degree of light convergence.

According to another aspect of the invention, there is provided a light shielding/reflecting type device (hereunder referred to as a third light shielding/reflecting type device of the invention) having a light source portion, which has a light emitting part, a reflecting mirror opposed to a light radiating side of the light source portion, and a light shielding plate, which has an optical opening portion. In this device, the light shielding plate is formed like film.

The light emitting part of the light source portion has a certain size. Therefore, strictly speaking, light convergence is performed so that light is focused onto a spot having a certain width in the vicinity of a focal point. Thus, in the case that the light shielding plate is thick, the efficiency in external radiation cannot be increased unless the width of the optical opening portion is increased. However, the light shielding plate is formed like a thin film. Thus, even when the width of the optical opening portion is narrow, high efficiency in external radiation can be obtained. Consequently, the width of the optical opening portion can be narrowed. An amount of external light entering the device can be reduced to a minimum value. Hence, the contrast between the intensity of light, which is radiated during the light source is turned on, and that of light reflected when the light source is turned off can be increased.

According to another aspect of the invention, there is provided a light source (hereunder referred to as a first light source of the invention) having a light emitting element, a light transmissive material, with which the light emitting element is sealed, and a substrate. In this light source, a part, on which the light emitting element is mounted, of the substrate is formed as a heat radiation conductive member. Moreover, the heat radiation conductive member leads to the back surface of the substrate.

Thus, the light emitting element is mounted on the heat radiation conductive member of the substrate. Further, the heat radiation conductive member leads to the back surface of the substrate. Thus, heat outputted from the light emitting element is transferred through this heat radiation conductive member to the back side of the substrate. Consequently, the efficiency in radiation of heat outputted fro the light emitting element is enhanced very much.

According to an embodiment (hereunder referred to as a second light source of the invention) of the first light source of the invention, a convex lens is formed from the light transmissive material in the first light source.

Therefore, light emitted from the light emitting element is caused by this convex lens to impinge upon the interface between the element and the light transmissive material at an angle in such a manner as to be nearly perpendicular thereto. Thus, when the second light source is used as the light source for the light shielding/reflecting type device, the light convergence is enhanced. Moreover, the efficiency in external radiation is increased to a high level.

According to an embodiment (hereunder referred to as a third light source of the invention) of the first or second light source of the invention, the substrate is shaped so that the four corners of the substrate are cut off.

Thus, because the four corners of the substrate are cut off, light reflected by the reflecting mirror is not blocked off by the four corners of the substrate when this light source is used in the light shielding/reflecting type device. Consequently, the light reflected by the reflecting mirror is externally radiated and effectively utilized.

According to an embodiment (hereunder referred to as a fourth light source of the invention) of the second light source of the invention, (a width of the substrate–a diameter of the convex lens)≦1 mm.

As compared with what is called a lead type light source, what is called a substrate type light source is advantageous in that because the lead is not protruded from the side surfaces thereof, the width of the substrate type light source can be narrowed by an amount for that. Thus, the size of the entire light source can be reduced by keeping an amount, by which the width of the substrate partly protruding from the convex lens is larger than the diameter of the convex lens, within 1 mm.

According to another aspect of the invention, there is provided a light shielding/reflecting type device (hereunder referred to as a fourth light shielding/reflecting type device of the invention) using the fourth light source of the invention.

In the case of the fourth light source of the invention, the size of the entire light source is reduced by keeping the amount, by which the width of the substrate partly protruding from the convex lens is larger than the diameter of the convex lens, within 1 mm. The use of such a light source in the light shielding/reflecting type device enables space-saving, change of the light source in such a way as to be close to a point light source, and more enhancement of efficiency in external radiation.

According to another aspect of the invention, there is provided a light shielding/reflecting type device (hereunder referred to as a fifth light shielding/reflecting type device of the invention) that comprises a substrate portion on which a light source portion is mounted. In this device, a part, on which the light source portion is mounted, is a heat radiation conductive member. Further, the heat radiation conductive member leads to the back surface of the substrate portion.

Thus, the light source portion is mounted on the heat radiation conductive member of the substrate portion. The heat radiation conductive member leads to the back surface of the substrate portion. Consequently, heat outputted from the light source portion is transmitted to the rear side of the substrate portion through the heat radiation conductive member. Thus, the efficiency in radiation of heat outputted from the light source portion is enhanced very much. To sum up, according to the present invention, there is provided a light emitting diode comprising: a substrate having a heat radiation conductive member therein; and a light emitting element mounted on said substrate, at least a part of said light emitting element being directly brought into contact and electrically connected with said heat radiation conductive member.

Features and advantages of the invention will be evident from the following detailed description of the preferred embodiments described in conjunction with the attached drawings.

DETAILED DESCRIPTION OF THE PREFERRED EMBODIMENTS

Hereinafter, embodiments of the invention is described with reference to the accompanying drawings.

First Embodiment

Figure 1A:
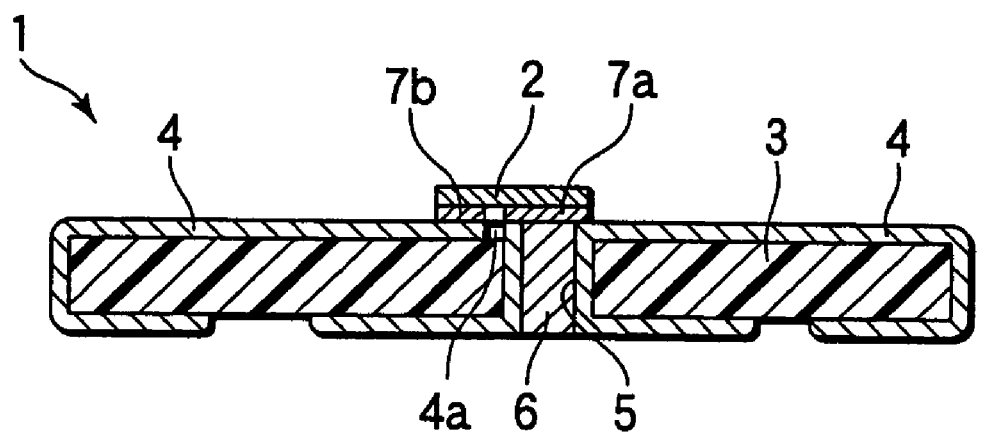
FIG. 1A is a longitudinally sectional view illustrating the entire configuration of a light emitting diode according to a first embodiment of the invention.
Figure 1B:
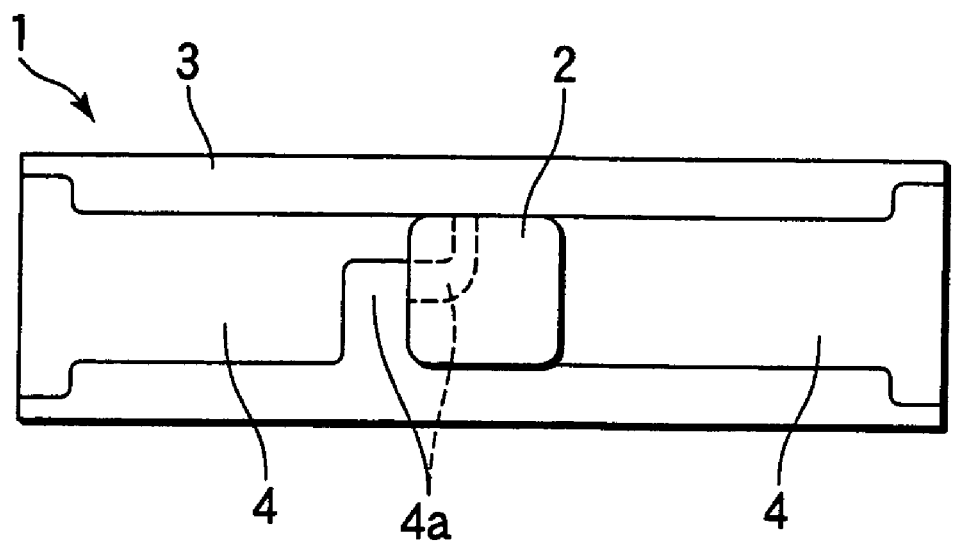
FIG. 1B is a plan view thereof.

First, a first embodiment of the invention is described with reference to FIGS. 1A and 1B. FIG. 1A is a longitudinally sectional view illustrating the entire configuration of a light emitting diode according to the first embodiment of the invention. FIG. 1B is a plan view thereof.

As illustrated in FIG. 1A, in an LED 1 of the first embodiment, a through hole 5 is drilled in a glass epoxy resin substrate. Moreover, a GaN light emitting element 2 is mounted on a through-hole substrate 3 having a conductive pattern 4 printed on the top and bottom surfaces thereof and on the inner surface of the through hole 5. The through hole 5 is filled with solder 6 acting as metal (heat radiation conductive member). One of the rear surface electrodes of the light emitting element 2 is electrically connected onto this through hole 5 by a gold bump 7a, while the other rear surface electrode is electrically connected to the side, which is insulated from the through hole 5, of the conductive pattern 4 by a gold bump 7b.

As viewed from above, the insulation between the gold bump 7a provided above the through hole 5 and the gold bump 7b provided on the conductive pattern 4 is ensured by a gap 4a between the conductive patterns 4. Thus, a flip-chip structure is formed.

Thus, in the LED 1 according to the first embodiment, the rear surface electrodes of the light emitting element 2 are connected directly to the through hole 5 and the conductive pattern 4 by gold bumps 7a and 7b to thereby form a flip-chip structure without interposing a zener diode, which used in the conventional device, between the rear surface electrode and the through hole or the conductive pattern. Consequently, the through hole 5 and the solder 6 filled thereinto serve as a heat sink. Thus, this LED extremely excels in heat radiation. As a result, even when the light emitting element 2 is at a high temperature, luminous efficiency does not lower. High luminous efficiency is maintained, and the device lifetime increases.

Further, the light emitting element 2 is mounted on the through hole substrate 3 on which the conductive patterns 4 are insulated from each other and printed by extending around to the back side of the substrate. Thus, the LED 1 can be surface-mounted thereon without change.

Thus, in the LED 1 of this embodiment, the light emitting element 2 sufficiently exhibits the characteristics thereof by forming a flip-flop structure without using a zener diode.

Second Embodiment

Figure 2A:
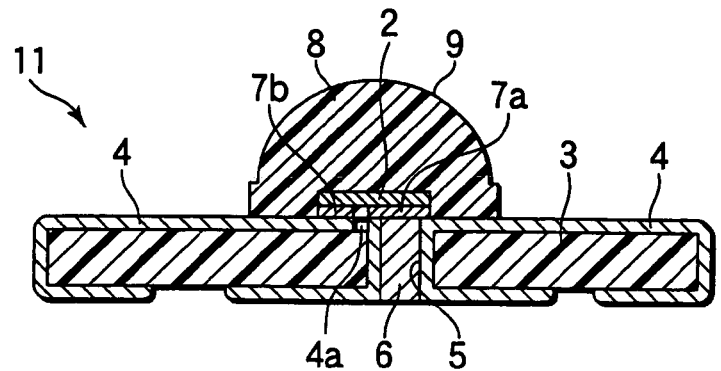
FIG. 2A is a longitudinally sectional view illustrating the entire configuration of a light emitting diode according to a second embodiment of the invention.
Figure 2B:
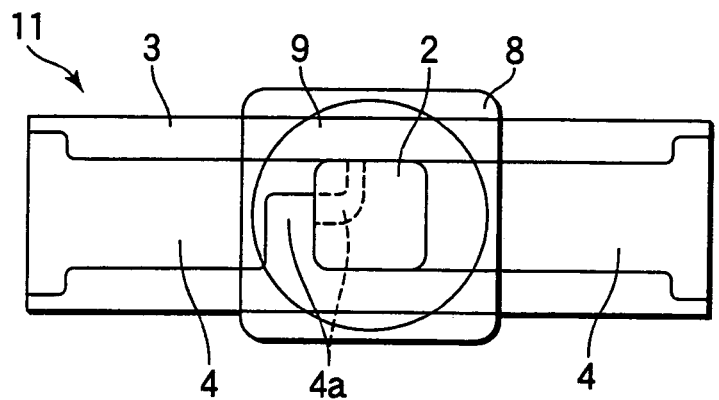
FIG. 2B is a plan view thereof.

Next, a second embodiment of the invention is described hereinafter with reference to FIGS. 2A and 2B. FIG. 2A is a longitudinally sectional view illustrating the entire configuration of a light emitting diode according to the second embodiment of the invention. FIG. 2B is a plan view thereof. Incidentally, like reference numerals designate like components of the first embodiment. Further, the description of such components is omitted herein.

As illustrated in FIGS. 2A and 2B, the LED 11 of this second embodiment differs from the LED 1 of the first embodiment in that in the former LED, the light emitting element 2 and a part of the through hole substrate 3 are sealed with transparent epoxy resin 8 serving as the light transmissive material, and that a light-emitting-surface-side part thereof is a convex lens 9 serving as a light radiating surface portion.

Thus, the quantity of light radiated from the light emitting element is increased by sealing the light emitting element with the light transmissive material, to a value that is almost twice that of light radiated from a light emitting element that is not sealed with such a material. Therefore, the efficiency in external radiation is extremely enhanced. Moreover, light emitted from the light emitting element 2 is converged and externally radiated by sealing the light emitting element with the light transmissive material and providing the light radiating surface of the convex lens 9 at the side of the light emitting surface of the light emitting element 2. Thus, this light emitting element 2 excels in optical characteristics. Furthermore, the LED 11 of the second embodiment can be surface-mounted thereon without change, similarly as the LED 1 of the first embodiment.

Thus, the LED 11 of the second embodiment excels in the luminous efficiency of the light emitting element 2, the device lifetime thereof, the efficiency in external radiation and the light convergence characteristics, is obtained by forming the flip-chip structure without using a zener diode, and by sealing the light emitting element with the transparent epoxy resin 8 and by providing a light radiating surface of the convex lens 9.

Third Embodiment

Figure 3:
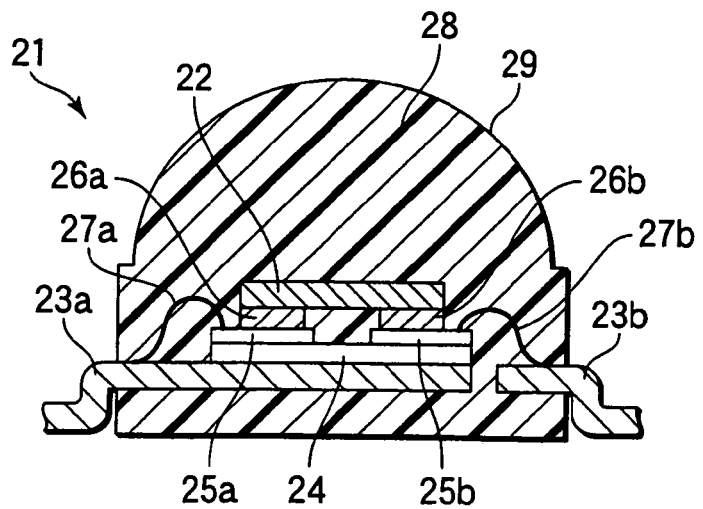
FIG. 3 is a longitudinally sectional view illustrating the entire configuration of a light emitting diode according to a third embodiment of the invention.

Next, a third embodiment of the invention is described hereinbelow with reference to FIG. 3. FIG. 3 is a longitudinally sectional view illustrating the entire configuration of a light emitting diode according to the third embodiment of the invention.

As illustrated in FIG. 3, in an LED 21 of this third embodiment, an insulating film 24, on which copper foils 25a and 25b serving as two conductive foils are provided apart from each other, is stuck onto one 23a of a pair of leads 23a and 23b for supplying electric power to a GaN light emitting element 22. The thickness of the insulating film 24 is about 100 μm, while the thickness of the copper foils 25a and 25b is about 20 μm. Thus, the two rear surface electrodes are connected to the insulated two copper foils 25a and 25b by gold bumps 26a and 26b, respectively. Further, the surface of the copper foil 25a is electrically connected to one 23a of the leads by bonding using a wire 27a. Furthermore, the surface of the copper foil 25b is electrically connected to the other lead 23b by bonding using a wire 27b. Thus, the light emitting element 22 is mounted on the one 23a of the leads by utilizing the flip-chip structure.

Furthermore, the light emitting element 22, a part of the pair of leads 23a, 23b, the insulating film 24, the copper foils 25a, 25b, the gold bumps 26a, 26b, and the wires 27a, 27b are sealed with the transparent epoxy resin 26 serving as the light transmissive material. Thus, the convex lens 29 serving as the light radiating surface portion is formed on the light emitting surface side, that is, the upper side of the light emitting element 22.

Thus, the quantity of light radiated from the light emitting element 22 is increased by sealing the light emitting element 22 with the transparent epoxy resin 28, to a value, which is almost twice that of light radiated from a light emitting element that is not sealed with such a material. Therefore, in the case of the LED 21, the efficiency in external radiation is extremely enhanced. Moreover, light emitted from the light emitting element 22 is converged and externally radiated by sealing the light emitting element 22 with the light transmissive material and providing the light radiating surface of the convex lens 29 at the side of the light emitting surface of the light emitting element 22. Thus, this light emitting element 22 excels in optical characteristics.

Thus, the LED 21 of the third embodiment excels in the luminous efficiency of the light emitting element 22, the device lifetime thereof, the efficiency in external radiation and the light convergence characteristics, is obtained by forming the flip-chip structure without using a zener diode, and by sealing the light emitting element with the transparent epoxy resin 28 and by providing a light radiating surface of the convex lens 29.

Fourth Embodiment

Figure 4A:
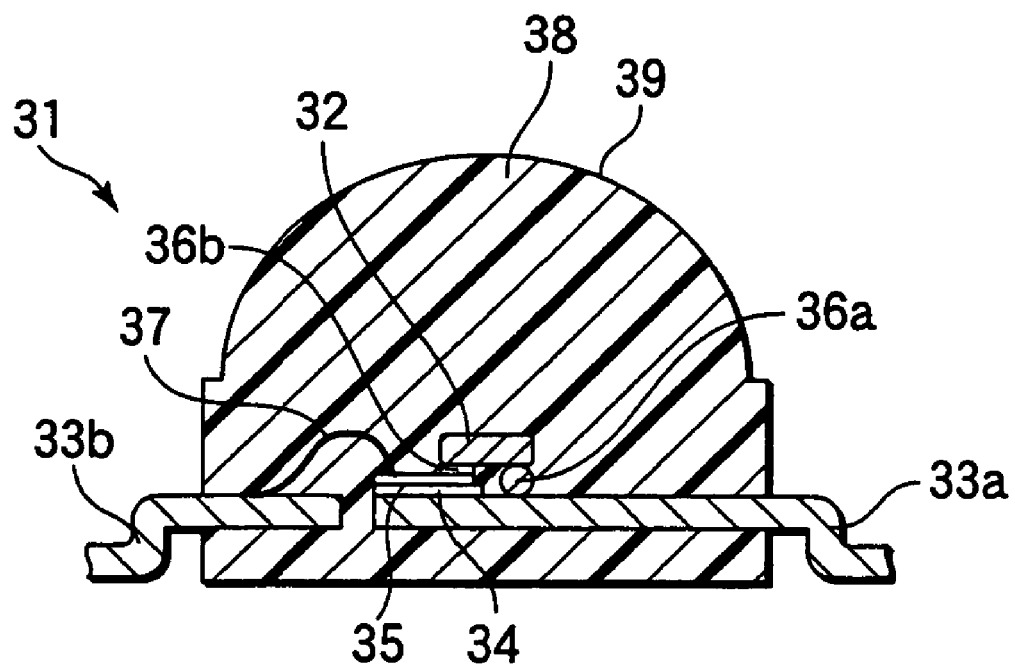
FIG. 4A is a longitudinally sectional view illustrating the entire configuration of a light emitting diode according to a fourth embodiment of the invention.
Figure 4B:
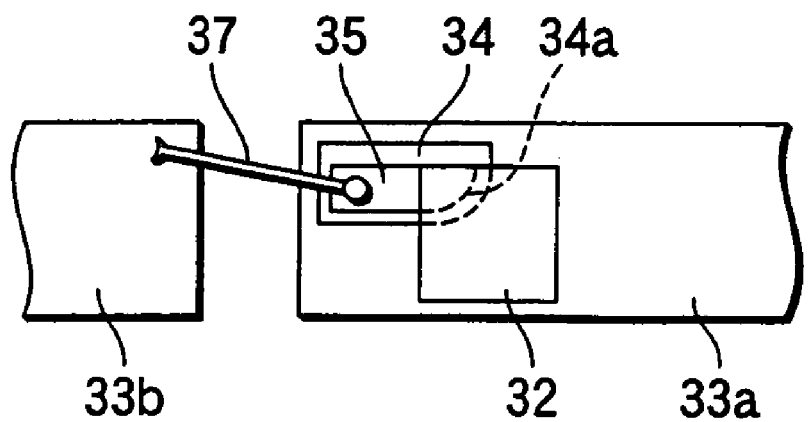
FIG. 4B is a partly enlarged plan view illustrating the periphery of a part, on which a light emitting element is mounted.

Next, a fourth embodiment of the invention is described hereinbelow with reference to FIGS. 4A and 4B. FIG. 4A is a longitudinally sectional view illustrating the entire configuration of a light emitting diode according to the fourth embodiment of the invention. FIG. 4B is a partly enlarged plan view illustrating the periphery of a part, on which a light emitting element is mounted.

As illustrated in FIG. 4A, in an LED 31 of the fourth embodiment, an insulating film 34, on which a pattern of a copper foil 35 serving as a conductive foil is stuck onto an end portion of one 33a of a pair of leads 33a and 33b for supplying electric power to a GaN light emitting element 32. The thickness of the insulating film 34 is about 100 am, while the thickness of the copper foil 35 is about 20 μm. The light emitting element 32 is connected to this copper foil 35 by a gold bump 36a so that only one of the rear surf ace electrodes of the light emitting element 32 is put thereon. The other rear surface electrode of the light emitting element 32 is connected directly to the one 33a of the leads by the gold bump 36a. Further, the surface of the copper foil 35 is electrically connected to the other lead 33b by bonding using a wire 37. Thus, the light emitting element 32 is mounted on the one 33a of the leads by utilizing the flip-chip structure.

As illustrated in FIG. 4B, when this portion, on which the light emitting element 32 is mounted, is seen from above, the insulation between the two rear surface electrodes of the light emitting element 32 is reliably maintained by a gap 4a provided by the insulating film 34. Further, the LED 31 of this fourth embodiment does not use two copper foils, differently from the LED 21 that uses the two copper foils. The other rear surface electrode of the light emitting element 32 is connected directly to the one 33a of the leads by the gold bump 36a. Thus, heat generated by a light emitting layer of the light emitting element 32 is dissipated directly to the one 33a of the leads without interposing the insulating film therebetween. Furthermore, the structure of the LED is simpler. Moreover, the manufacturing of the LED is a flip-chip structure is easily achieved. Consequently, the cost of the LED 31 can be reduced.

Further, the light emitting element 32, a part of the pair of leads 33a, 33b, the insulating film 34, the copper foil 35, the gold bumps 36a, 36b, and the wire 37 are sealed with the transparent epoxy resin 36 serving as the light transmissive material. Thus, the convex lens 39 serving as the light radiating surface portion is formed on the light emitting surface side, that is, the upper side of the light emitting element 32.

Thus, the quantity of light radiated from the light emitting element 32 is increased by sealing the light emitting element 32 with the transparent epoxy resin 38, to a value, which is almost twice that of light radiated from a light emitting element that is not sealed with such a material. Therefore, in the case of the LED 31, the efficiency in external radiation is extremely enhanced. Moreover, light emitted from the light emitting element 32 is converged and externally radiated by sealing the light emitting element 32 with the light transmissive material and providing the light radiating surface of the convex lens 39 at the side of the light emitting surface of the light emitting element 32. Thus, this light emitting element 32 excels in optical characteristics.

Thus, the LED 31 of the fourth embodiment excels in the luminous efficiency of the light emitting element 32, the device lifetime thereof, the efficiency in external radiation and the light convergence characteristics, is obtained by forming the flip-chip structure without using a zener diode, and by sealing the light emitting element with the transparent epoxy resin 38 and by providing a light radiating surface of the convex lens 39.

Fifth Embodiment

Figure 5A:
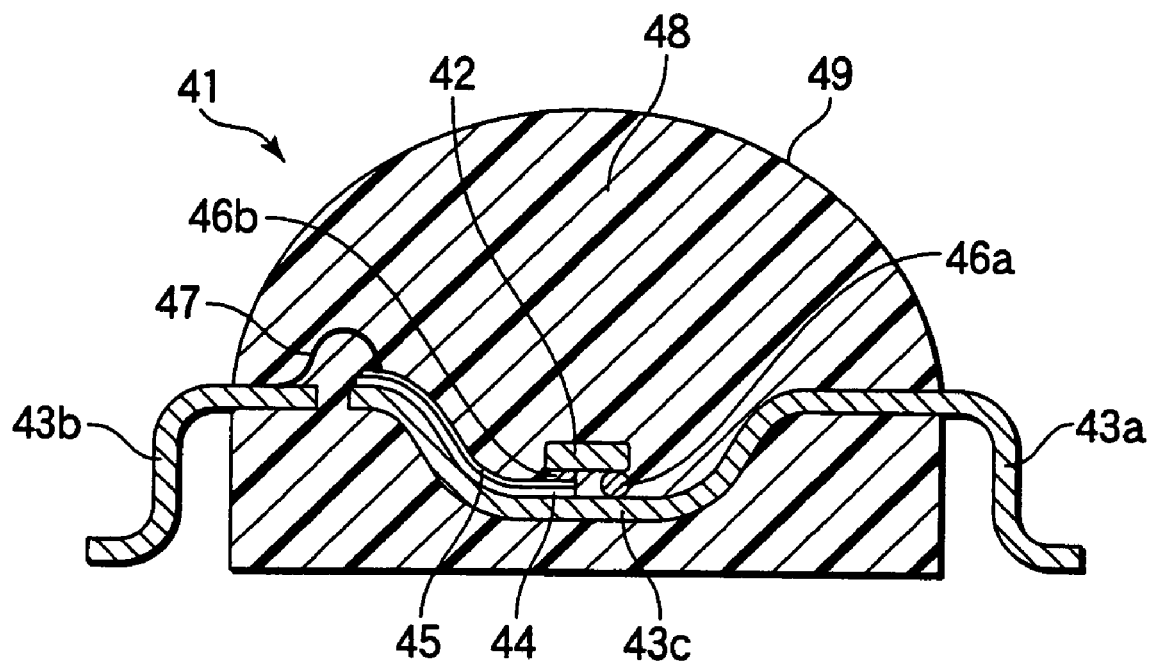
FIG. 5A is a longitudinally sectional view illustrating the entire configuration of a light emitting diode according to a fourth embodiment of the invention.
Figure 5B:
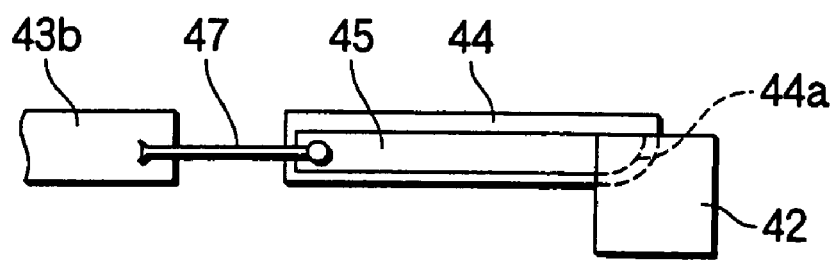
FIG. 5B is a partly enlarged plan view illustrating the periphery of a part, on which a light emitting element is mounted.

Next, a fifth embodiment of the invention is described hereinbelow with reference to FIGS. 5A and 5B. FIG. 5A is a longitudinally sectional view illustrating the entire configuration of a light emitting diode and a manufacturing method therefor according to the fifth embodiment of the invention. FIG. 5B is a partly enlarged plan view illustrating the periphery of a part, on which a light emitting element is mounted.

As illustrated in FIG. 5A, in the LED 41 of this fifth embodiment, a somewhat long insulating film 44 is stuck onto one 43a of a pair of leads 43a and 43b for supplying electric power to a GaN light emitting element 42. Then, a copper foil 45 serving as the conductive foil is stuck thereon. The thickness of the insulating film 44 is about 100 μm, while the thickness of the copper foil 45 is about 20 μm.

Then, the stamping of the one 43a of leads is performed to thereby form a concave reflecting mirror 43c. Subsequently, an end of each of the insulting film 44 and the copper foil 45 is placed at the central portion of the reflecting mirror 43c. Moreover, a concave surface of the reflecting mirror 43c is processed in such a way as to be round-cornered. Thus, the light emitting element 42 can be mounted at the central portion of the reflecting mirror 43c. Furthermore, the conductive foil 45 can be reliably prevented by round-cornering the concave surface of the reflecting mirror from being cut off during the stamping. Subsequently, at the central portion of the reflecting mirror 43c, one of the rear surface electrodes of the light emitting element 42 is electrically connected to one end of the conductive foil 45 by a gold bump 46b. Moreover, the other of the rear surface electrodes of the light emitting element 42 is connected directly to one 43a of the leads by a gold bump 46a. Then, the other end of the copper foil 45 is electrically connected to the other lead 43b by bonding using a wire 47. Thus, the flip-chip structure is formed.

Further, the light emitting element 42, a part of the pair of leads 43a, 43b, the reflecting mirror 43c, the insulating film 44, the copper foil 45, the gold bumps 46a, 46b, and the wire 47 are sealed with the transparent epoxy resin 48 serving as the light transmissive material. Thus, the convex lens 49 serving as the light radiating surface portion is formed on the light emitting surface side, that is, the upper side of the light emitting element 42.

Thus, the quantity of light radiated from the light emitting element 42 is increased by sealing the light emitting element 42 with the transparent epoxy resin 48, to a value, which is almost twice that of light radiated from a light emitting element that is not sealed with such a material. Therefore, in the case of the LED 41, the efficiency in external radiation is extremely enhanced. Moreover, light emitted from the light emitting element 42 is converged and externally radiated by sealing the light emitting element 42 with the light transmissive material and providing the light radiating surface of the convex lens 49 at the side of the light emitting surface of the light emitting element 42. Thus, this light emitting element 42 excels in optical characteristics. Further, light outputted in a horizontal direction from the light emitting surface of the light emitting element 42 is reflected and irradiated by such a concave reflecting mirror in a direction nearly perpendicular to the light emitting surface thereof. Thus, the efficiency in external radiation from this LED is enhanced.

Thus, the LED 41 of the fourth embodiment excels in the luminous efficiency of the light emitting element 42, the device lifetime thereof, the efficiency in external radiation and the light convergence characteristics, is obtained by forming the flip-chip structure without using a zener diode, and by sealing the light emitting element with the transparent epoxy resin 48 and by providing a light radiating surface of the convex lens 49. Furthermore, the efficiency I external radiation is more enhanced by forming the concave reflecting mirror 43c.

Sixth Embodiment

Figure 6:
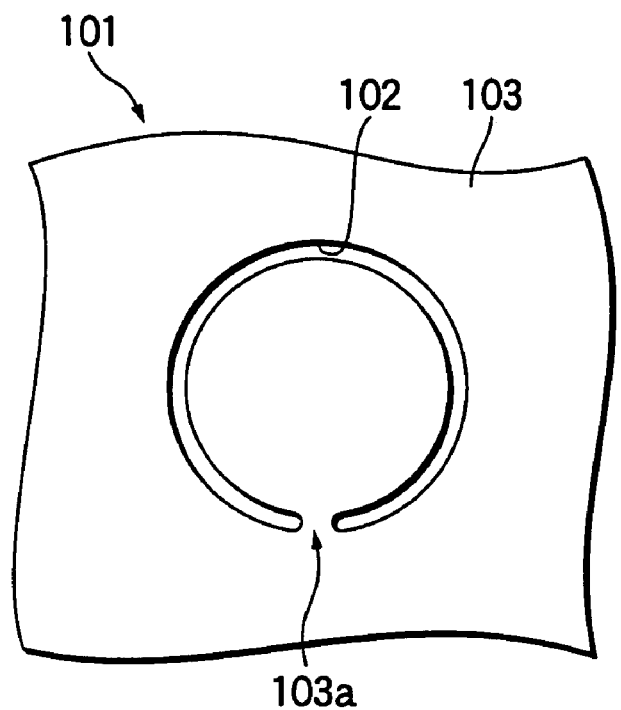
FIG. 6 is a front view illustrating the periphery of an optical opening portion of a light shielding/reflecting type device according to a sixth embodiment of the invention.
Figure 7:
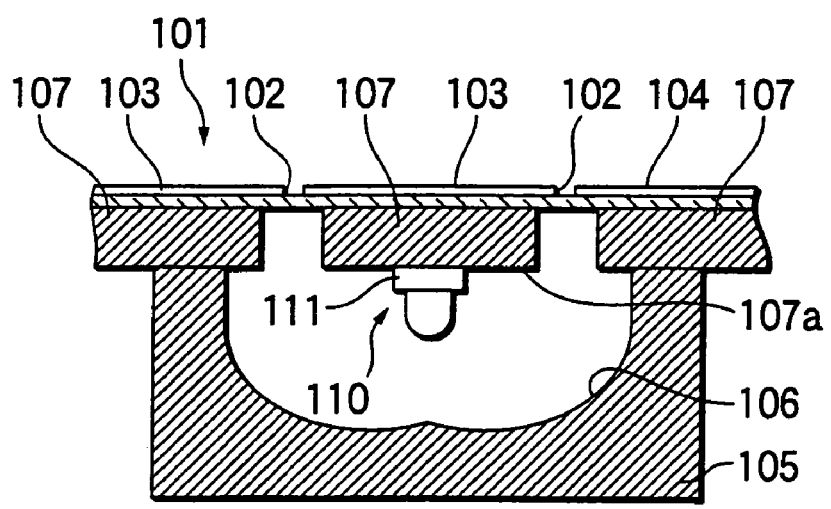
FIG. 7 is a longitudinally sectional view illustrating the light shielding/reflecting type device according to sixth embodiment of the invention.
Figure 8:
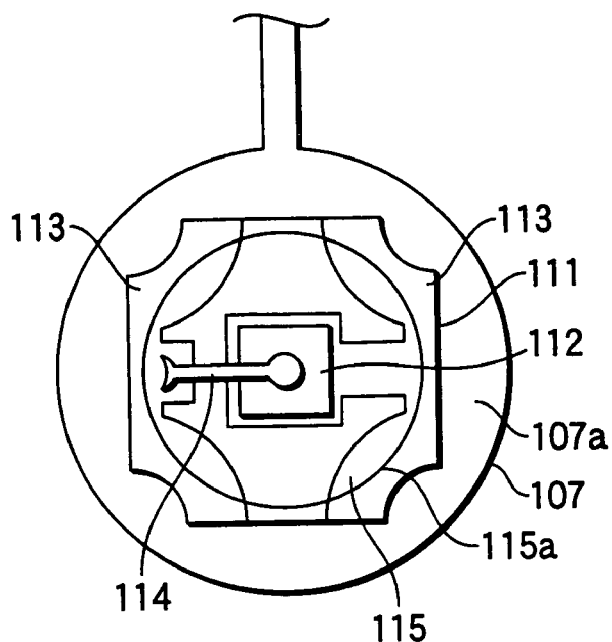
FIG. 8 is a plan view illustrating the entire configuration of a light source according to the sixth embodiment of the invention.
Figure 9:
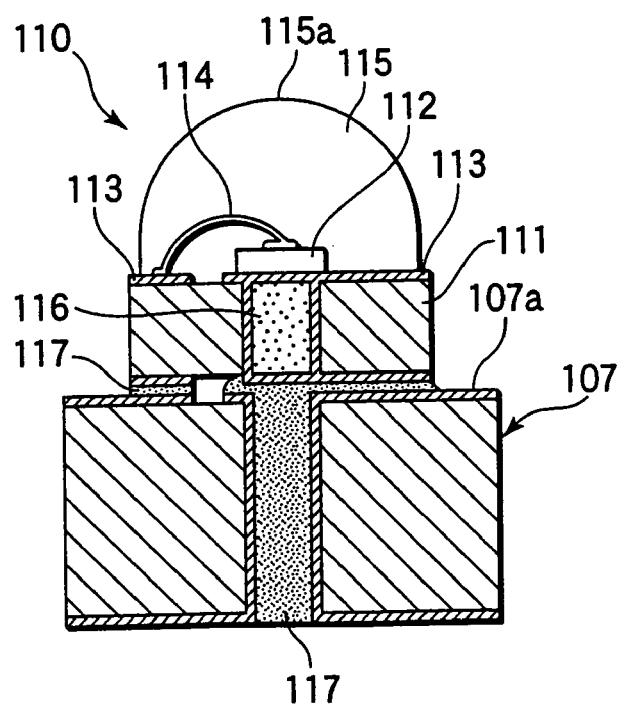
FIG. 9 is a longitudinally sectional view illustrating the entire configuration of the light source of the sixth embodiment of the invention.

A light shielding/reflecting type device (light emitting diode) and a light source therefor according to a sixth embodiment of the invention are described hereinbelow by referring to FIGS. 6 to 9. FIG. 6 is a front view illustrating the periphery of an optical opening portion of a light shielding/reflecting type device according to the sixth embodiment of the invention. FIG. 7 is a longitudinally sectional view illustrating the light shielding/reflecting type device according to the sixth embodiment of the invention. FIG. 8 is a plan view illustrating the entire configuration of a light source according to the sixth embodiment of the invention. FIG. 9 is a longitudinally sectional view illustrating the entire configuration of the light source of the sixth embodiment of the invention.

As illustrated in FIG. 6, a nearly circular optical opening portion 102 of the light shielding/reflecting type LED1 serving as the light shielding/reflecting type device of the sixth embodiment of the invention is very thin. The reason why high efficiency of external radiation can be obtained even in the case of using such a thin optical opening portion 102 is that the optical opening portion 102 is provided in a black PET film 103 that is 0.1 mm in thickness. This black PET film 103 is sandblasted, so that the front and rear surfaces thereof are put into a matted state.

As illustrated in FIG. 7, a light source 110 of the light shielding/reflecting type LED 101 is a lens type LED in which the light emitting element is sealed with a transparent epoxy resin. A concave type reflecting surface to be obtained by rotating a part of an ellipse, whose two foci are respectively located at the light source 110 and the optical opening portion 102, around the central axis of the light source 110 is formed in an reflecting substrate 105 obtained by injection-molding acrylic resin. Then, a reflecting mirror 106 is formed by performing aluminum evaporation on this reflecting surface. Therefore, all the light outputted from the light source 110 and reflected by the reflecting mirror 106 is passed through the optical opening portion 102 and externally radiated. Incidentally, the light emitting element of the light source 110 has a certain size. Therefore, strictly speaking, light convergence is performed so that light is focused onto a spot having a certain width in the vicinity of a focal point. Thus, in the case that the light shielding plate 103 is thick, the efficiency in external radiation cannot be increased unless the width of the optical opening portion 102 is increased. However, in the first embodiment, the light shielding plate 103 is a film that is 0.1 mm in thickness. Thus, even when the width of the optical opening portion 102 is narrow, high efficiency in external radiation can be obtained.

The light shielding plate 103 is stuck onto a transparent glass plate 104 that is 0.6 mm in thickness. A substrate portion 107 manufactured from a both-side through-hole glass epoxy substrate. The light source 110 is attached to the bottom surface of the substrate portion 107 through a substrate 111 of the light source portion.

Next, the detail configuration of the light source portion and the substrate portion are describe hereinbelow with reference to FIGS. 8 and 9. The substrate 111 of the light source portion is used by cutting the glass epoxy both-side through-hole substrate so that the four corners thereof correspond to through holes. Thus, the substrate 111 is formed into a shape in which the four corners are cut off. Consequently, the substrate 111 is adapted in such a manner as not to block light reflected by the reflecting mirror 106. Furthermore, a through hole is formed in a central portion on which the light emitting element 112 is mounted. A hollow portion of the through hole is filled with metal powder 116 (heat radiation conductive member). Then, the through hole is closed by plating. During performing automatic wire bonding, in the case that the light emitting element 112 is mounted thereon in an inclined manner, a recognition rate lowers. However, flatness is obtained by filling the through hole with the metal powder 116 and closing the through hole by plating 113. Thus, there is no influence on the operating ratio during performing automatic wire bonding.

Then, the light emitting element 112 is mounted on the plating. Subsequently, the electric connection between the light emitting element 112 and a component is performed by a wire 114. Moreover, a semispherical lens 115a, whose origin is located at the position of the light emitting element 112, is formed by using transparent epoxy resin 115. Thus, light emitted by the light emitting element 112 impinges upon the transparent epoxy resin 115 perpendicularly thereto. Thereafter, the incident light is externally radiated therefrom without undergoing refraction. Consequently, an apparent light emitting area of the light source portion can be minimized. The light source portions 110 and 111 manufactured in this manner are put on the substrate portion 107. The substrate portion 107 is obtained by cutting the both-side through-hole substrate, which is thicker than the substrate 111, in such a way as to be shaped nearly like a cylinder. A portion upwardly extended, as viewed in FIG. 8, corresponds to the continuous portion 3a of the light shielding plate 103. The through hole of the substrate portion 107 is placed just under the portion, with which the metal powder 116 is filled, of the substrate 111. This through hole is filled with solder 117. Further, during the insulation between the left-side part of the substrate 111 and that of the substrate 107 and the insulation between the right-side part of the substrate 111 and that of the substrate 107 are maintained, the electrical connection between the left-side parts of the substrates 107 and 111 and that between the right-side parts thereof are established by solder 117. Thus, the metal powder 116 is filled into the through hole provided just under the light emitting element 112. Moreover, the solder 117 is filled into the through hole immediately under that through hole. Consequently, heat outputted from the light emitting element 112 is transmitted through the metal powder 116 and the solder 117 to the outside. Thus, the light source 110 is formed in such a way as to excel in heat radiation.

Further, black-silk printing is performed on the surface 107a of the substrate portion 107 and the periphery of the cylindrical portion. Thus, external light entering the light shielding/reflecting type LED 1 from the optical opening portion 102 of FIGS. 6 and 7 is reflected by the reflecting mirror 106 and then impinges upon the surface 107a of the substrate 107 and absorbed therein. Therefore, an occurrence of a phenomenon, in which the external light reflected by the reflecting mirror 106 at a turn-off of the light is outputted from the optical opening portion 102 and travels the outside again, that is, what is called a pseudo-lighting is completely prevented. This realizes a light shielding/reflecting type device LED 101, which is large in contrast between the intensity of light, which is radiated during the light source is turned on, and that of light reflected when the light source is turned off.

Thus, the light shielding/reflecting type device LED 101, which is high in the efficiency in external radiation and large in contrast between the intensity of light radiated during the light source is turned on, and that of light reflected when the light source is turned off, and which excels in heat radiation, and the light source 110 therefor are obtained.

Seventh Embodiment

Figure 10:
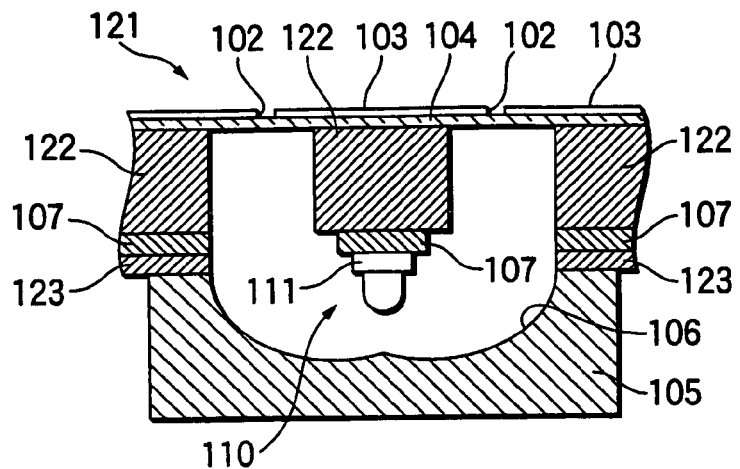
FIG. 10 is a longitudinally sectional view illustrating a light shielding/reflecting type device according to a seventh embodiment of the invention.
Figure 11:
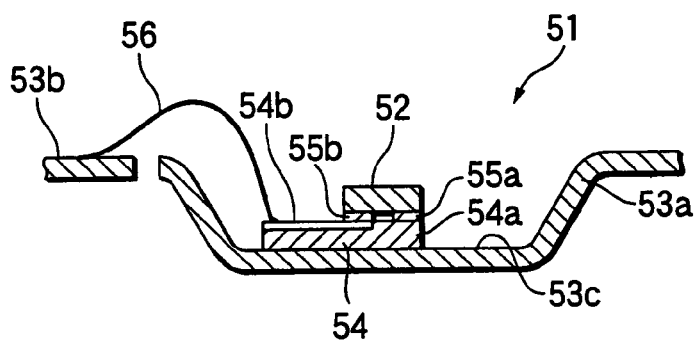
FIG. 11 is a sectional view illustrating the configuration of a part, on which a light emitting element is mounted, of a light emitting diode.
Figure 12:
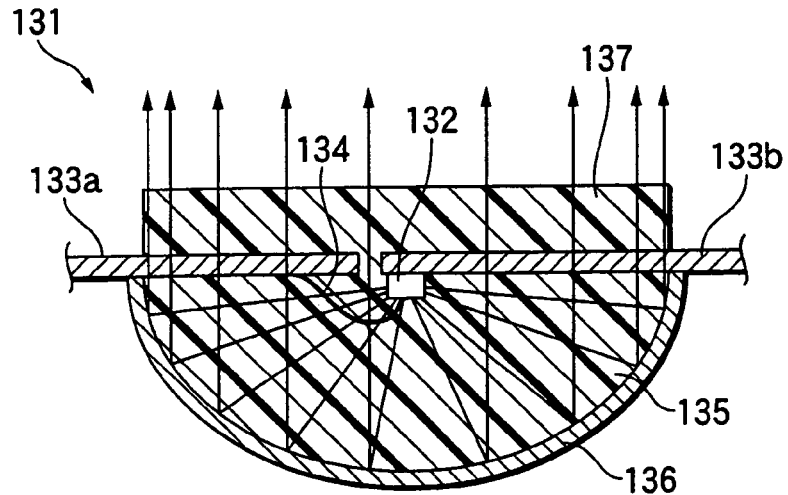
FIG. 12 is a sectional view illustrating an example of a reflective LED.

Next, a light shielding/reflecting type LED according to a seventh embodiment of the invention is described hereinbelow with reference to FIG. 10. FIG. 10 is a longitudinally sectional view illustrating the light shielding/reflecting type LED according to the seventh embodiment.

The light shielding/reflecting type LED 121 according to the seventh embodiment of the invention differs from the light shielding/reflecting type LED 101 in that a first spacer 122 is sandwiched between the glass plate 104 and the through hole substrate 107, and that a second spacer 123 is sandwiched between the through hole substrate 107 and a reflecting substrate 105. Thus, the focal length from the light source 110 to the optical opening portion 102 is lengthened. The second embodiment has light distribution characteristics that provide a high degree of light convergence.

Further, black-silk printing is performed on each of the surface of the substrate portion 107, and the surfaces of the first spacer 122 and the second spacer 123. Thus, external light entering the light shielding/reflecting type LED 121 from the optical opening portion 102 is reflected by the reflecting mirror 106 and then impinges upon the substrate portion 107, and the surfaces of the first spacer 122 and the second spacer 123 and absorbed therein. Therefore, an occurrence of a phenomenon, in which the external light reflected by the reflecting mirror 106 at a turn-off of the light is outputted from the optical opening portion 102 and travels the outside again, that is, what is called a pseudo-lighting is completely prevented. This realizes a light shielding/reflecting type device LED 121, which is large in contrast between the intensity of light radiated during the light source is turned on, and that of light reflected when the light source is turned off.

Thus, the light shielding/reflecting type LED 121, which is high in the efficiency in external radiation and large in contrast between the intensity of light radiated during the light source is turned on, and that of light reflected when the light source is turned off, and which excels in heat radiation, is obtained.

Although the light shielding/reflecting type LEDs 101 and 121 each using an LED as the light source portion have been described in the sixth and seventh embodiments as examples of the light shielding/reflecting type device, the light source portion of the invention is not limited to the LED. The invention maybe applied to a light shielding/reflecting type device using another type light source, such as an EL. The LED light emitting elements are suitable for use in light shielding/reflecting type devices, because the light emitting area is small, so that the light convergence width in the light convergence portion can be narrowed.

Further, although an example, in which black-silk printing is performed on the entire surface of the substrate portion 107, has been described in the foregoing description of sixth and seventh embodiments, it may be permitted that only a portion, which is at the side of a mounting side part 7a of each of the light source portions 10 and 11 of the substrate portion 7 is black.

Furthermore, although it has been described that the substrate portion is constituted by the glass epoxy substrate, other materials, such as a ceramic substrate, may be used. Alternatively, a metal stem may be employed.

Although the case of sealing the light emitting element and a pair of leads with the transparent epoxy resin serving as the light transmissive material has been described in the foregoing description of the aforementioned second to fifth embodiments, the light emitting element and the pair of leads are not necessarily sealed with resin serving as the light transmissive material. Moreover, although the case of forming the convex lens as the light radiating surface portion formed by the transparent epoxy resin has been described hereinabove, surface portions of various shapes, such as a flat surface portion, may be used as the light radiating surface portion.

Further, although examples of using a transparent epoxy resin as the light transmissive material used for a sealing material have been described in the foregoing description of the aforementioned embodiments, any other light transmissive materials, such as a transparent silicon resin, may be used as long as such light transmissive materials meet the conditions relating to the fluidity and filling ability thereof before hardened, and to the transparency and strength thereof after hardened.

The invention is not limited to the configuration, shape, number, material, size, and connecting relation among other components of the aforementioned embodiments, and other steps of the manufacturing method according to the aforementioned embodiments.

As described above, the first light emitting diode of the invention has a flip-chip-type light emitting element. In this diode, a through hole of a through-hole substrate is filled with metal. Further, one of rear surface electrodes of the light emitting element is connected onto the through hole. Moreover, the other of the rear surface electrodes of the light emitting element is connected to a conductive pattern insulated from the through hole of the through-hole substrate.

In the case of the LED of such a configuration, fine and precise conductive patterns of the through hole substrate can be formed. Thus, two rear surface electrodes, the distance between which is very short, of the light emitting element can be adapted so that one of the rear surface electrodes is reliably connected onto the through hole, while the other of the rear surface electrodes is reliably connected onto the conductive pattern insulated from the through hole by maintaining the insulation therebetween. Further, because the through hole is filled with metal, the through hole can serve as a heat sink. Thus, the LED excels in heat radiation. Consequently, luminous efficiency is maintained at a high level. The device lifetime can be increased.

Thus, the LED, which sufficiently exhibits the characteristics of the light emitting element, is provided by forming a flip-chip structure without using a zener diode.

The second light emitting diode of the invention has a flip-chip-type light emitting element. This diode comprises an insulating film fixed on the top surface of one of a pair of leads for supplying electric power to the light emitting element. This diode comprises two conductive foils formed on the insulating film in such a way as to be away from each other. In this diode, rear surface electrodes of the light emitting element are respectively connected to the two conductive foils. Further, one of the two conductive foils is electrically connected to the one of leads, and the other of the two conductive foils is electrically connected to the other of the pair of leads.

In the LED of such a configuration, one of the rear surface electrodes of the light emitting element is connected to the conductive foil insulated from one of the leads through the insulating film. Further, the conductive foil is electrically connected to the other lead by a wire. In contrast, the other of the rear surface electrodes of the light emitting element is connected directly to the one of the leads by a gold bump. Thus, the rear surface electrodes of the light emitting element are electrically connected to the one of the leads and the other lead, respectively. The flip-chip structure is formed in this manner. Further, a part of the light emitting element is put on the one of the leads through an extremely thin insulating film and conductive foil, while the remaining part of the light emitting element is put directly on the one of the leads. Consequently, this LED extremely excels in heat radiation. Further, luminous efficiency is maintained at a high level. The device lifetime can be increased.

Thus, the LED, which sufficiently shows the characteristics of the light emitting element, is provided by forming a flip-chip structure without using a zener diode.

The third light emitting diode of the invention has a flip-chip-type light emitting element. This diode comprises an insulating film fixed on a top surface of one of a pair of leads for supplying electric power to the light emitting element, and a conductive foil formed on the insulating film. In this diode, one of rear surface electrodes of the light emitting element is connected to the conductive foil. The other of the rear surface electrodes, and the conductive foil is electrically connected to the other of the pair of leads.

In the LED of such a configuration, one of the rear surface electrodes of the light emitting element is connected to the conductive foil insulated from one of the leads through the insulating film. Further, the conductive foil is electrically connected to the other lead by a wire. In contrast, the other of the rear surface electrodes of the light emitting element is connected directly to the one of the leads by a gold bump. Thus, the rear surface electrodes of the light emitting element are electrically connected to the one of the leads and the other lead, respectively. The flip-chip structure is formed in this manner. Further, a part of the light emitting element is put on the one of the leads through an extremely thin insulating film and conductive foil, while the remaining part of the light emitting element is put directly on the one of the leads. Consequently, this LED extremely excels in heat radiation. Further, luminous efficiency is maintained at a high level. The device lifetime can be increased.

Thus, the LED, which sufficiently exhibits the characteristics of the light emitting element, is provided by forming a flip-chip structure without using a zener diode.

According to the fourth light emitting diode of the invention, a concave reflecting mirror is formed from the one of leads in the third light emitting diode of the invention. Moreover, the light emitting element is placed on the bottom surface of the reflecting mirror.

Light outputted in a horizontal direction from the light emitting surface of the light emitting element is reflected and irradiated by such a concave reflecting mirror in a direction nearly perpendicular to the light emitting surface thereof. Thus, the efficiency in external radiation from this LED is enhanced. Further, one of the rear surface electrodes of the light emitting element is insulated from one of leads by an insulating film and connected to the conductive foil extended to the edge of the reflecting mirror constituted by the one of the leads. Furthermore, the conductive foil is electrically connected to the other lead by a wire. In contrast, the other of the rear surface electrodes of the light emitting element is connected directly to the one of the leads by a gold bump. Consequently, the rear surface electrodes of the light emitting element are electrically connected to the one of the leads and the other lead, respectively. Thus, the flip-chip structure is formed. Therefore, the light emitting element is mounted on the bottom surface of the reflecting mirror through no zener diodes. Consequently, this LED can sufficiently serve as the reflecting mirror. Thus, sufficient optical characteristics can be obtained.

Further, a part of the light emitting element is put on the one of the leads through an extremely thin insulating film and conductive foil, while the remaining part of the light emitting element is put directly on the one of the leads.

Thus, the LED, which sufficiently shows the luminous efficiency, the device lifetime, and the optical characteristics of the light emitting element, is provided by forming both the flip-chip structure and the reflecting mirror without using a zener diode.

According to the fifth light emitting diode of the invention, a part of the through-hole substrate or a part of the pair of leads, and the light emitting element are sealed with a light transmissive material. In the fifth light emitting diode, a surface portion, which is provided at the side of a light emitting surface of the light emitting element, of the light transmissive material is formed as a light radiating surface portion.

The fifth light emitting diode of the invention has the following effects, in addition to the first to fourth light emitting diodes of the invention. That is, a quantity of light radiated from the light emitting element sealed with a light transmissive material in this manner is about twice that of light radiated in the case of the light emitting element, which is not sealed. Thus, the efficiency in external radiation is extremely enhanced. Moreover, because the light emitting element is mounted by forming the flip-chip structure without using a zener diode, this LED extremely excels in heat radiation. Furthermore, high luminous efficiency is maintained, and the device lifetime increases.

Thus, the LED, which sufficiently shows the luminous efficiency, the device lifetime, and the optical characteristics of the light emitting element, is provided by forming the flip-chip structure and sealing the light emitting element with the light transmissive material without using a zener diode.

According to the sixth light emitting diode of the invention, the light radiating surface portion is a convex lens.

Thus, the sixth light emitting diode of the invention has the following effects, in addition to the effects of the fifth light emitting diode of the invention. That is, light emitted from the light emitting element is converged and externally radiated by sealing the light emitting element with the light transmissive material and providing the light radiating surface of the convex lens at the side of the light emitting surface of the light emitting element. Thus, this LED excels in optical characteristics. Moreover, the quantity of light radiated from the light emitting element is increased by sealing the light emitting element with the light transmissive material, to a value, which is almost twice that of light radiated from a light emitting element that is not sealed with such a material. Thus, the efficiency in external radiation is extremely enhanced. Moreover, because the light emitting element is mounted by forming the flip-chip structure without using a zener diode, this LED extremely excels in heat radiation. Furthermore, high luminous efficiency is maintained, and device lifetime increases.

Thus, the LED, which more excels in the luminous efficiency, the device lifetime, the efficiency in external radiation and the light convergence characteristics, is obtained by forming the flip-chip structure without using a zener diode, and by sealing the light emitting element with the light transmissive material and by providing a light radiating surface of the convex lens.

The first manufacturing method of the invention comprises the step of sticking an insulating film, on which a conductive foil is put, to a part of one of a pair of leads for supplying electric power to a light emitting element, the step of stamping the one of leads to thereby form a concave reflecting mirror, at the central portion of which one of ends of the conductive foil of the insulating film is placed, and the step of processing a concave surface of the reflecting mirror in such a way as to be round-cornered, and the step of connecting one of rear surface electrodes of the light emitting element to an end of the conductive foil at the central portion of the concave reflecting mirror, and the step of electrically connecting the other end of the conductive foil to the one of the pairs of the leads.

According to this method of manufacturing the light emitting diode, after sticking an insulating film, on which a conductive foil is put, onto one of a pair of leads, the stamping of the one of leads is performed to thereby form a concave reflecting mirror. Then, an end of each of the film and the foil is placed at the central portion of the reflecting mirror. Moreover, a concave surface of the reflecting mirror is processed in such a way as to be round-cornered. Thus, the light emitting element can be mounted at the central portion of the reflecting mirror. Furthermore, the conductive foil can be reliably prevented by round-cornering the concave surface of the reflecting mirror from being cut off during the stamping. Subsequently, at the central portion of the reflecting mirror, one of the rear surface electrodes of the light emitting element is electrically connected to one end of the conductive foil by a gold bump. Moreover, the other of the rear surface electrodes of the light emitting element is connected directly to one of the leads by a gold bump. Then, the other end of the conductive foil is electrically connected to the other lead by a wire. Thus, the flip-chip structure is formed.

According to this method of manufacturing a light emitting diode, the light emitting element can be mounted thereon by utilizing the flip-chip structure without using a zener diode. Moreover, the conductive foil for electrically connecting one of the rear surface electrodes of the light emitting element to the other lead can be reliably prevented from being cut off during the reflecting mirror is formed. Further, the light emitted from the light emitting surface of the light emitting element in the horizontal direction is reflected in the direction, which is nearly perpendicular to the light emitting surface, so that the efficiency in external radiation from the LED is enhanced.

Thus, the heat radiation from the light emitting element is enhanced by forming the flip-chip structure without using a zener diode and by forming a round-cornered concave reflecting mirror. Consequently, the first manufacturing method of manufacturing LEDs, which excels in the luminous efficiency, the device lifetime, and can obtain sufficient optical characteristics, and provide highly reliable electrical connection, is provided.

According to the second manufacturing method of the invention, the step of sealing a part of the pair of leads, the reflecting mirror, and the light emitting element with a light transmissive material, and forming a surface, which is provided at a side of a light emitting surface of the light emitting element, of the light transmissive material as a light radiating surface is added to the first manufacturing method.

The second manufacturing method of the invention has the following effects, in addition to those of the first manufacturing method of the invention. That is, a quantity of light radiated from the light emitting element sealed with a light transmissive material in this manner is about twice that of light radiated in the case of the light emitting element, which is not sealed. Thus, the efficiency in external radiation is extremely enhanced. Moreover, because the light emitting element is mounted at the central portion of the reflecting mirror by forming the flip-chip structure without using a zener diode, this LED extremely excels in heat radiation. Furthermore, high luminous efficiency is maintained, and the device lifetime increases, and the efficiency in external radiation is enhanced.

Thus, this LED manufacturing method, which more excels in the luminous efficiency, the device lifetime, and the efficiency in external radiation of the light emitting element, is provided by forming the flip-chip structure without using a zener diode and by sealing the light emitting element with the light transmissive material to thereby form the light radiating surface.

According to the third manufacturing method of the invention, the light radiating surface portion is a convex lens.

The third manufacturing method of the invention has the following effects, in addition to those of the second manufacturing method of the invention. That is, thus, light emitted from the light emitting element is converged and externally radiated by sealing the light emitting element with the light transmissive material and providing the light radiating surface of the convex lens at the side of the light emitting surface of the light emitting element. Thus, the third manufacturing method excels in optical characteristics. Moreover, the quantity of light radiated from the light emitting element is increased by sealing the light emitting element with the light transmissive material, to a value, which is almost twice that of light radiated from a light emitting element that is not sealed with such a material. Thus, the efficiency in external radiation is extremely enhanced. Moreover, because the light emitting element is mounted at the central portion of the reflecting mirror by forming the flip-chip structure without using a zener diode, the third manufacturing method extremely excels in heat radiation. Furthermore, the high luminous efficiency is maintained, and the device lifetime increases, and the efficiency in external radiation is enhanced.

Thus, the LED, which more excels in the luminous efficiency, the device lifetime, the efficiency in external radiation and the light convergence characteristics, is obtained by forming the flip-chip structure without using a zener diode, and by sealing the light emitting element with the light transmissive material and by providing a light radiating surface of the convex lens.

Still further, as described above, according to an aspect of the invention, there is provided the first light shielding/reflecting type device having a light source portion, which has a light emitting portion, a reflecting mirror opposed to a light radiating side of the light source portion, and a light shielding plate, which has an optical opening portion. This device comprises a substrate portion on which the light source portion is mounted. Further, the side, on which the light source portion is mounted, of the substrate portion is black.

Incidentally, the optical opening portion is an opening part, through which light can pass, and may be either a through hole or a hole filled with a light transmissive material.

The light shielding/reflecting type device of such a structure has the substrate portion on which the light source portion is mounted. The side, on which the light source portion is mounted, of the substrate portion is black. Thus, even in the case that external light is incident from the optical opening portion when the light source is turned off, the incident light is reflected by the reflecting mirror to the side, on which the light source portion is mounted, of the substrate portion and absorbed thereinto. Therefore, the incident light does not return to the outside. Consequently, an occurrence of pseudo-lighting is completely prevented. Thus, the contrast between the intensity of light, which is radiated during the light source is turned on, and that of light reflected when the light source is turned off, is increased.

Thus, the light shielding/reflecting type device is high inefficiency in external radiation and large in contrast between the intensity of light, which is radiated during the light source is turned on, and that of light reflected when the light source is turned off.

The second light shielding/reflecting type device of the invention further comprises a spacer for changing a height of the substrate portion. This spacer is black.

Thus, the second light shielding/reflecting type device of the invention has the following effects, in addition to those of the first light shielding/reflecting type device. That is, the focal length thereof is increased by providing the spacer therein. Consequently, the second light shielding/reflecting type device has light distribution characteristics that provide a high degree of light convergence.

The third light shielding/reflecting type device of the invention has a light source portion, which has a light emitting part, a reflecting mirror opposed to a light radiating side of the light source portion, and a light shielding plate, which has an optical opening portion. In this device, the light shielding plate is formed like film.

The light emitting part of the light source portion has a certain size. Therefore, strictly speaking, light convergence is performed so that light is focused onto a spot having a certain width in the vicinity of a focal point. Thus, in the case that the light shielding plate is thick, the efficiency in external radiation cannot be increased unless the width of the optical opening portion is increased. However, the light shielding plate is formed like a thin film. Thus, even when the width of the optical opening portion is narrow, high efficiency in external radiation can be obtained. Consequently, the width of the optical opening portion can be narrowed. An amount of external light entering the device can be reduced to a minimum value. Hence, the contrast between the intensity of light, which is radiated during the light source is turned on, and that of light reflected when the light source is turned off can be increased.

The first light source of the invention has a light emitting element, a light transmissive material, with which the light emitting element is sealed, and a substrate. In this light source, a part, on which the light emitting element is mounted, of the substrate is formed as a heat radiation conductive member. Moreover, the heat radiation conductive member leads to the back surface of the substrate.

Thus, the light emitting element is mounted on the heat radiation conductive member of the substrate. Further, the heat radiation conductive member leads to the back surface of the substrate. Thus, heat outputted from the light emitting element is transferred through this heat radiation conductive member to the back side of the substrate. Consequently, the efficiency in radiation of heat outputted fro the light emitting element is enhanced very much.

The second light source of the invention is constructed by forming a convex lens from the light transmissive material in the first light source.

Therefore, light emitted from the light emitting element is caused by this convex lens to impinge upon the interface between the element and the light transmissive material at an angle in such a manner as to be nearly perpendicular thereto. Thus, when the second light source is used as the light source for the light shielding/reflecting type device, the light convergence is enhanced. Moreover, the efficiency in external radiation is increased to a high level.

According to the third light source of the invention, the substrate is shaped in the first or second light source of the invention so that the four corners of the substrate are cut off.

Thus, the third light source has the following effects, in addition to those of the first or second light source. That is, because the four corners of the substrate are cut off, light reflected by the reflecting mirror is not blocked off by the four corners of the substrate when this light source is used in the light shielding/reflecting type device. Consequently, the light reflected by the reflecting mirror is externally radiated and effectively utilized.

The fourth light source of the invention is constructed by adapting the second light source of the invention so that (a width of the substrate–a diameter of the convex lens)$\leq 1$ mm.

As compared with what is called a lead type light source, what is called a substrate type light source is advantageous in that because the lead is not protruded from the side surfaces thereof, the width of the substrate type light source can be narrowed by an amount for that. Thus, the size of the entire light source can be reduced by keeping an amount, by which the width of the substrate partly protruding from the convex lens is larger than the diameter of the convex lens, within 1 mm.

The fourth light shielding/reflecting type device of the invention uses the fourth light source of the invention.

In the case of the fourth light source of the invention, the size of the entire light source is reduced by keeping the amount, by which the width of the substrate partly protruding from the convex lens is larger than the diameter of the convex lens, within 1 mm. The use of such a light source in the light shielding/reflecting type device enables space-saving, change of the light source in such a way as to be close to a point light source, and more enhancement of efficiency in external radiation.

The fifth light shielding/reflecting type device of the invention comprises a substrate portion on which a light source portion is mounted. In this device, a part, on which the light source portion is mounted, is a heat radiation conductive member. Further, the heat radiation conductive member leads to the back surface of the substrate portion.

Thus, the light source portion is mounted n the heat radiation conductive member of the substrate portion. The heat radiation conductive member leads to the back surface of the substrate portion. Consequently, heat outputted from the light source portion is transmitted to the rear side of the substrate portion through the heat radiation conductive member. Thus, the efficiency in radiation of heat outputted from the light source portion is enhanced very much.

Further, the present invention is not limited to the above-mentioned embodiments. It can be carried out in various modes without departing from the scope of the invention.

What is claimed is:

1. A light emitting diode comprising:
   a substrate including a heat radiation conductive member therein;
   a light emitting element mounted on a part of said substrate including said heat radiation conductive member, at least a part of said light emitting element being directly brought into contact and electrically connected with said heat radiation conductive member;
   a reflecting mirror opposed to a light radiating side of said light emitting element; and
   a light shielding plate having an optical opening portion and disposed opposed to said reflecting mirror,
   wherein said heat radiation conductive member leads to a back surface of said substrate being opposed to a surface on which said light emitting element is mounted.

2. A light emitting diode according to claim 1, further comprising a light transmissible material for sealing said light emitting element.

3. A light emitting diode according to claim 2, wherein a convex lens is formed from said light transmissive material.

4. A light emitting diode according to claim 1, wherein said light emitting element is mounted on a part of said substrate above said heat radiation conductive member.

5. A light emitting diode according to claim 1, wherein said substrate comprises:
   a through hole, wherein said heat radiation conductive member is disposed in said through hole of said substrate.

6. A light emitting diode according to claim 1, wherein said heat radiation conductive member comprises:
   metal powder disposed in a through hole formed in said substrate.

7. A light emitting diode according to claim 6, wherein said metal powder in said through hole is encapsulated by an electrically conductive plating.

8. A light emitting diode according to claim 1, wherein said heat radiation conductive member is disposed in a first through hole formed in said substrate,
wherein said light shielding plate comprises a second through hole which is aligned with said first through hole formed in said substrate, and
wherein electrically conductive material is disposed in said second through hole formed in said light shielding plate.

9. A light emitting diode comprising:
a substrate including a heat radiation conductive member therein; and
a light emitting element mounted on a part of said substrate including said heat radiation conductive member, at least a part of said light emitting element being directly brought into contact and electrically connected with said heat radiation conductive member;
wherein said heat radiation conductive member leads to a back surface of said substrate being opposed to a surface on which said light emitting element is mounted.

10. A method of manufacturing a light emitting diode according to claim 9, wherein said light radiating surface comprises a convex lens.

11. A light emitting diode according to claim 9, wherein said light emitting element is mounted on a part of said substrate above said heat radiation conductive member.

12. A light emitting diode according to claim 9, wherein said substrate comprises:
a through hole, wherein said heat radiation conductive member is disposed in said through hole of said substrate.

13. A light shielding/reflecting type device comprising:
a substrate;
a light emitting element mounted on said substrate;
a reflecting mirror opposed to a light radiating side of said light emitting element; and
a light shielding plate having an optical opening portion and disposed opposed to said reflecting mirror;
wherein a side of said substrate, on which said light emitting element is mounted, is black.

14. A light emitting diode according to claim 13, further comprising a spacer for changing a height of said substrate portion, wherein said spacer is black.

15. A light shielding/reflecting type device comprising:
a substrate;
a light emitting element mounted on said substrate;
a reflecting mirror opposed to a light radiating side of said light emitting element; and
a light shielding plate having an optical opening portion and disposed opposed to said reflecting mirror;
wherein said light shielding plate is formed like film.

16. A light source comprising:
a substrate;
a light emitting element mounted on said substrate; and
a light transmissive material for sealing said light emitting element;
wherein a part of said substrate, on which said light emitting element is mounted, is formed as a heat radiation conductive member, and said heat radiation conductive member leads to a back surface of said substrate.

17. A light source according to claim 16, wherein a convex lens is formed from said light transmissive material.

18. A light source comprising:
a substrate;
a light emitting element mounted on said substrate; and
a light transmissive material for sealing said light emitting element;
wherein a part of said substrate, on which said light emitting element is mounted, is formed as a heat radiation conductive member, and said heat radiation conductive member leads to a back surface of said substrate, and
wherein said substrate is shaped so that four corners of said substrate are cut off.

19. A light source according to claim 18, wherein (a width of said substrate–a diameter of said convex lens)<1 mm.

20. A light emitting diode comprising:
a substrate including a heat radiation conductive member therein; and
a light emitting element mounted on a part of said substrate including said heat radiation conductive member, at least a part of said light emitting element being directly brought into contact and electrically connected with said heat radiation conductive member;
wherein said heat radiation conductive member leads to a back surface of said substrate being opposed to a surface on which said light emitting element is mounted, and
wherein said heat radiation conductive member comprises:
metal powder disposed in a through hole formed in said substrate.

21. A light emitting diode according to claim 20, wherein said metal powder in said through hole is encapsulated by an electrically conductive plating.

* * * * *